United States Patent [19]
Fukushima et al.

[11] Patent Number: 5,208,079
[45] Date of Patent: May 4, 1993

[54] PROCESS FOR IMPROVING THE RESISTANCE TO CORROSION OF STAINLESS STEEL

[75] Inventors: Makoto Fukushima, Kumagaya; Kikuo Takizawa, Kazo, both of Japan

[73] Assignee: Sanyo Electric Co., Ltd., Osaka, Japan

[21] Appl. No.: 888,892

[22] Filed: May 26, 1992

[30] Foreign Application Priority Data

May 27, 1991 [JP] Japan ................................. 3-174280

[51] Int. Cl.$^5$ ............................................. C23C 14/00
[52] U.S. Cl. .................... 427/527; 427/405; 427/419.7; 427/528; 427/530; 427/531
[58] Field of Search ............... 427/527, 405, 419.7, 427/528, 530, 531

Primary Examiner—Bernard Pianalto
Attorney, Agent, or Firm—Darby & Darby

[57] ABSTRACT

There is provided a process for improving the resistance to corrosion of stainless steel by ion plating process, the process comprising coating a component-adjusted stainless steel having an Mn/S ratio of less than 100 as substrate with a Ti-layer for surface preparation, coating directly the resulting Ti-layer or indirectly a TiC-layer, which has been coated onto the Ti-layer in advance as intermediate, with a TiN-layer in a total thickness of 1 to 3 μm.

The TiN-coated stainless steel according to the present invention may be widely used as corrosion-resistant metallic materials for preparing articles which can be employed under wet conditions such as tableware.

2 Claims, 11 Drawing Sheets

PROCESS FOR IMPROVING THE RESISTANCE TO CORROSION OF STAINLESS STEEL

BACKGROUND OF THE INVENTION

(1) Field of the Invention

The present invention relates to a process for improving the resistance to corrosion of stainless steels. The process may be widely employed for preparing metallic substrates for use in the making of tableware.

(2) Description of the Prior Art

The stainless steels designated "SUS 304 steel" in JIS G4303 and having the composition as shown in Table 1 have been known as corrosion-resistant metallic materials, widely used as substrates for preparing TiN-coated stainless steels by ion plating process.

TABLE 1

| (% by Wt.) | | | | | | |
|---|---|---|---|---|---|---|
| C | Si | Mn | P | S | Ni | Cr |
| <0.08 | <1.0 | <2.0 | <0.04 | <0.03 | 8.0–10.5 | 18.0–20.0 |

As is well known to those skilled in the art, various metals or metal compounds can be coated by ion plating the desired thickness onto a metallic substrate.

By ion plating, the metallic substrate can be isolated and protected from a severely corrosive environment, thus retaining its useful properties for a long period of time. Therefore, ion plating is a popular method used in developing various corrosion-resistant materials for preparing metallic articles.

In TiN-coating by conventional ion plating processes, when the amount of nonmetallic impurities such as sulfide-base impurities is too large in the steel, the environment-isolating effect of the coating cannot be exerted sufficiently under wet conditions due to the presence of defects caused by the impurities.

Therefore, conventional ion plating processes do not provide improved corrosion resistance to the metallic substrate for preparing metallic articles which can be used under wet circumstances.

SUMMARY OF THE INVENTION

The improved TiN-coated stainless steels according to the present invention may be used as metallic substrates for use in the making of articles which can be used under wet circumstances such as tableware, and may be prepared by a process according to the present invention comprising component-adjusting a SUS 304 steel as a corrosion-resistant substrate, and coating uniformly the substrate with a TiN-layer, which is said to have an environment-isolating effect, by ion plating process.

According to a first aspect of the present invention, there is provided a process for improving the resistance to corrosion of stainless steels by ion plating process, the process comprising coating a component-adjusted stainless steel having an Mn/S ratio of less than 100 as substrate with a Ti-layer for surface preparation, coating directly the resulting Ti-layer or indirectly a TiC-layer, which has been coated onto the Ti-layer in advance as intermediate, with a TiN-layer in a total thickness of 1 to 3 μm, the composition of the component-adjusted stainless steel comprising the following A or B:

| A | | B | |
|---|---|---|---|
| % by Wt. | Element | % by Wt. | Element |
| less than 0.08 | C | less than 0.08 | C |
| less than 1.0 | Si | less than 1.0 | Si |
| less than 1.0 | Mn | less than 1.0 | Mn |
| less than 0.04 | P | less than 0.04 | P |
| less than 0.01 | S | 0.005 to 0.010 | S |
| 8.0 to 12.0 | Ni | 8.0 to 12.0 | Ni |
| 17.0 to 20.0 | Cr | 17.0 to 20.0 | Cr |
| 0.40 to 0.80 | Mo | 0.40 to 0.80 | Mo |
| the balance | Fe | the balance | Fe |

According to a second aspect of the present invention, there is provided a process for improving the resistance to corrosion of stainless steels by ion plating process, the process comprising coating a component-adjusted stainless steel as substrate with a Ti-layer for surface preparation, coating directly the resulting Ti-layer or indirectly a TiC-layer, which has been coated onto the Ti-layer in advance as intermediate, with a TiN-layer in a total thickness of 1 to 3 μm, the composition of the component-adjusted stainless steel comprising the following A or B:

| A | | B | |
|---|---|---|---|
| % by Wt. | Element | % by Wt. | Element |
| less than 0.08 | C | less than 0.08 | C |
| less than 1.0 | Si | less than 1.0 | Si |
| less than 0.7 | Mn | less than 0.7 | Mn |
| less than 0.04 | P | less than 0.04 | P |
| less than 0.005 | S | less than 0.005 | S |
| 8.0 to 12.0 | Ni | 8.0 to 12.0 | Ni |
| 17.0 to 20.0 | Cr | 17.0 to 20.0 | Cr |
| 0.40 to 0.80 | Mo | 0.40 to 0.80 | Mo |
| 0.30 to 0.50 | Cu | 0.10 to 0.30 | Cu |
| the balance | Fe | 0.03 to 0.12 | Bi |
| | | the balance | Fe |

Mn or S has a deleterious effect upon the corrosion resistance of the steel. It is desirable to decrease the content as low as possible. Inversely, when the content is lowered, the machinability of the resulting steel deteriorates unpreferably. Therefore, in the first aspect of the present invention, the content of Mn or S in the steel substrate is adjusted to less than 1.0% by wt. for Mn and less than 0.01% by wt. for S. When the content of S is more than 0.005% by wt., Mn/S is adjusted to a ratio of less than 100. In the second aspect of the invention, the content of Mn is adjusted to less than 0.7% by wt. and S is adjusted to less than 0.005% by wt. When machinability is required, Bi may be added to increase its machinability. The preferred amount of Bi is in a range of 0.03 to 0.12% by wt. When the amount is less than 0.03% by wt., the improving-effect of Bi on the machinability cannot be exerted sufficiently, inversely, when the amount is more than 0.12% by wt., the forgeability becomes poor unpreferably.

Ni is one of the fundamental components of the austenitic (γ) stainless steels and is added to stabilize the γ-phase. As for corrosion prevention, Ni provides a corrosion-inhibitory effect to the steel, especially in the active state zone. Further, Ni gives a marked corrosion-inhibitory effect to the steel in the presence of a neutral chloride solution or a non-oxidizing acid. Moreover, the addition of Ni can provide an enhanced passive state. For this purpose, Ni is in an amount of 8.0 to 12.0% by wt.

Cr is one of the essential components for stainless steel, and added in an amount of 17.0 to 20.0% by wt.

Mo is added to extend the passive state zone and to enhance the corrosion resistance. The preferred amount of Mo is in a range of 0.40 to 0.80% by wt. When the amount of Mo is less than 0.40% by wt., the corrosion-resisting effect cannot be exerted sufficiently, inversely, when the amount is more than 0.80% by wt., any additional and beneficial effect cannot be exerted.

Cu is added to increase the resistance to corrosion of the steel against non-oxidizing acids. The corrosion-inhibitory effect of Cu can be exerted remarkably in the coexistence of Mo. The preferred amount of Cu, which can increase the resistance to corrosion of the steel under various conditions, is in a range of 0.30 to 0.50% by wt. When the amount is too large, the resistance to corrosion against organic acids deteriorates. When Bi is added, the preferred amount of Cu to provide good hot working properties is in a range of 0.10 to 0.30% by wt.

C, Si or P is in the range as specified by JIS for SUS 304 steel.

The component-adjusted stainless steel thus prepared is then coated with a Ti-layer for surface preparation by ion plating process, followed by coating directly the Ti-layer or indirectly a TiC-layer, which has been coated in advance as intermediate onto the Ti-layer, with a TiN-layer in a total thickness of 1 to 3 $\mu$m, whereby a wet corrosion-resistant metallic material having a uniform and flawless coating with a marked environment-isolating effect can be obtained.

DETAILED DESCRIPTION OF THE PREFERRED EMBODIMENTS

Now, the present invention will be described in detail in reference to Examples.

EXAMPLE 1

The chemical composition of the stainless steel employed as a substrate of the present invention is tabulated in Table 2.

Specimen 1 was made of SUS 304, a commercial product, and used as a control run.

Specimen 2, 3 or 4 was made of the component-adjusted steel according to claim 1 of the present invention.

Specimen 5 was used as a control run to determine the effect of the Mn/S ratio.

TABLE 2

| / | C | Si | Mn | P | S | Ni | Cr | Mo | Mn/S |
|---|---|---|---|---|---|---|---|---|---|
| | | | | (% by Wt.) Specimen | | | | | |
| 1 | 0.05 | 0.49 | 0.98 | 0.034 | 0.022 | 8.11 | 18.21 | — | 44.52 |
| 2 | 0.05 | 0.51 | 0.19 | 0.025 | 0.002 | 10.55 | 18.80 | 0.51 | 95.03 |
| 3 | 0.05 | 0.29 | 0.80 | 0.011 | 0.010 | 10.45 | 18.96 | 0.52 | 80.04 |
| 4 | 0.05 | 0.35 | 0.89 | 0.022 | 0.009 | 10.48 | 18.77 | 0.50 | 98.95 |
| 5 | 0.05 | 0.36 | 1.15 | 0.023 | 0.009 | 10.61 | 18.88 | 0.50 | 127.8 |

Each specimen was pretreated by polishing and ultrasonic cleaning, followed by ion plating at a temperature of 300° C. and a bias impressed voltage of −60 V.

The ion plating was carried out by the process comprising coating the substrate with a Ti-layer for surface preparation, coating the Ti-layer with a TiC layer, and further coating the TiC-layer with a TiN-layer, giving a specimen having a three-layered structure coating.

Table 3 gives the total thickness of the three-layered coating comprising Ti, TiC and TiN layers.

A total thickness of 2 $\mu$m was achieved for Specimens 1, 3, 4 and 5, whereas in Specimens 2 the thickness was 0.5, 2 and 4 $\mu$m respectively.

TABLE 3

| Specimen No. | Total Thickness ($\mu$m) |
|---|---|
| 1 | 2 |
| 2 2-1 | 0.5 |
| 2-2 | 2 |
| 2-3 | 4 |
| 3 | 2 |
| 4 | 2 |
| 5 | 2 |

Resistance to General Corrosion

Figure 1:
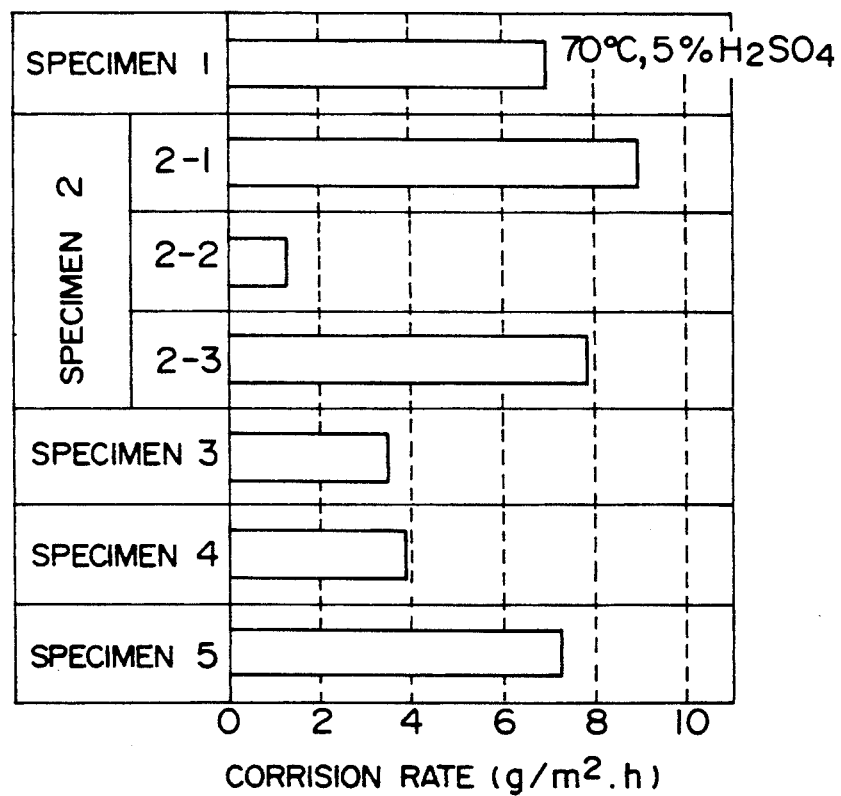
FIG. 1 shows corrosion rate curves for Specimens 1, 2, 3, 4 and 5 in an aqueous 5%-$H_2SO_4$ solution at 70° C.

FIG. 1 shows the corrosion rate curves for the Specimens 1 to 5 in an aqueous 5%-$H_2SO_4$ solution at 70° C. From the curves in FIG. 1 it can be seen that Specimen 2-2 having a coating with a thickness of 2 $\mu$m has the lowest corrosion rate, showing the enhanced environment-isolating effect and good resistance to corrosion of the resultant coating.

However, in Specimen 2-1 having a coating with a thickness of 0.5 $\mu$m the environment-isolating effect and the improvement effect on corrosion resistance cannot be exerted sufficiently because the total thickness of the coating is too thin.

Inversely, in Specimen 2-3 having a coating with a thickness of 4 $\mu$m the presence of defects such as cracks or delamination was observed because of an increase in residual stress on the coating, giving a partially peeled coating poor in resistance to corrosion.

On the other hand, in Specimen 3 or 4 according to the present invention, which contains Mn or S in a larger amount than that for Specimen 2, the corrosion rate is somewhat more rapid than that for Specimen 2-2 but is about one-half of that for Referential Specimens 1 or 5, showing a significant improvement in resistance to corrosion.

Therefore, it is obvious that in Specimens 2-2, 3 or 4 according to the present invention the active state zone has good resistance to dissolution, resulting in the improvement in resistance to corrosion of the specimen.

Figure 2:
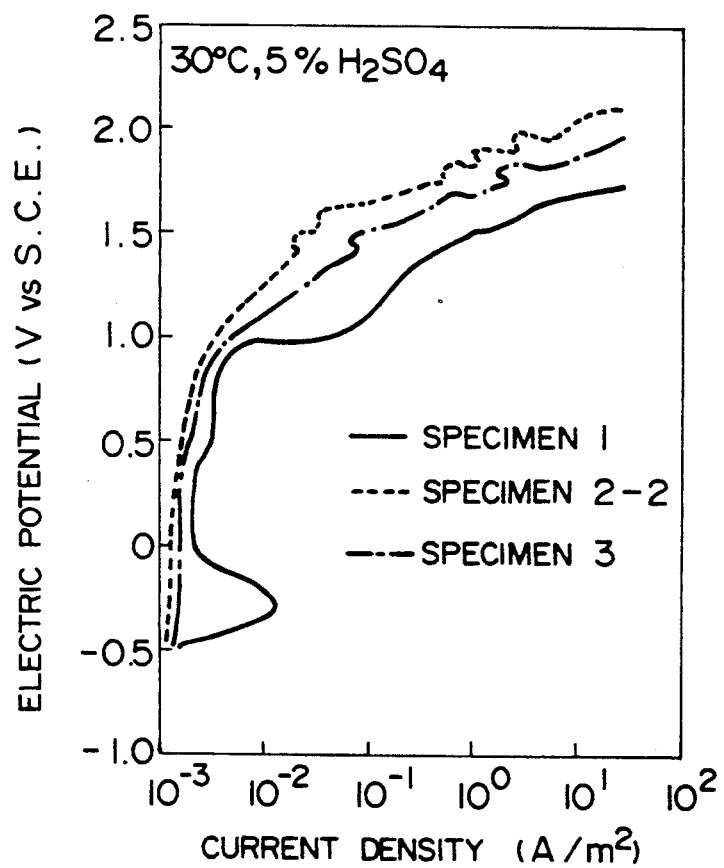
FIG. 2 shows anode polarization curves for Specimens 1, 2-2 and 3 in an aqueous 5%-$H_2SO_4$ solution at 30° C.

FIG. 2 shows anode polarization curves for Specimens 1, 2-2 and 3 in an aqueous 5%-$H_2SO_4$ solution at 30° C. In the curve for Referential Specimen 1 a clear peak in current density or the presence of an active state dissolution zone is observed. Inversely, in Specimen 2-2 or 3 according to the present invention such an active state dissolution zone cannot be observed. Moreover, the passivity-retaining current density for Specimen 2-2 or 3 is lower than that for Referential Specimen 1. Therefore, it can be seen that the passive state for Specimen 2-2 or 3 is more stable than Referential Specimen 1.

From these comparison data, it can be seen that Specimen 2-2 or 3 is more corrosion-resistant than that for Referential Specimen 1.

Figure 3:
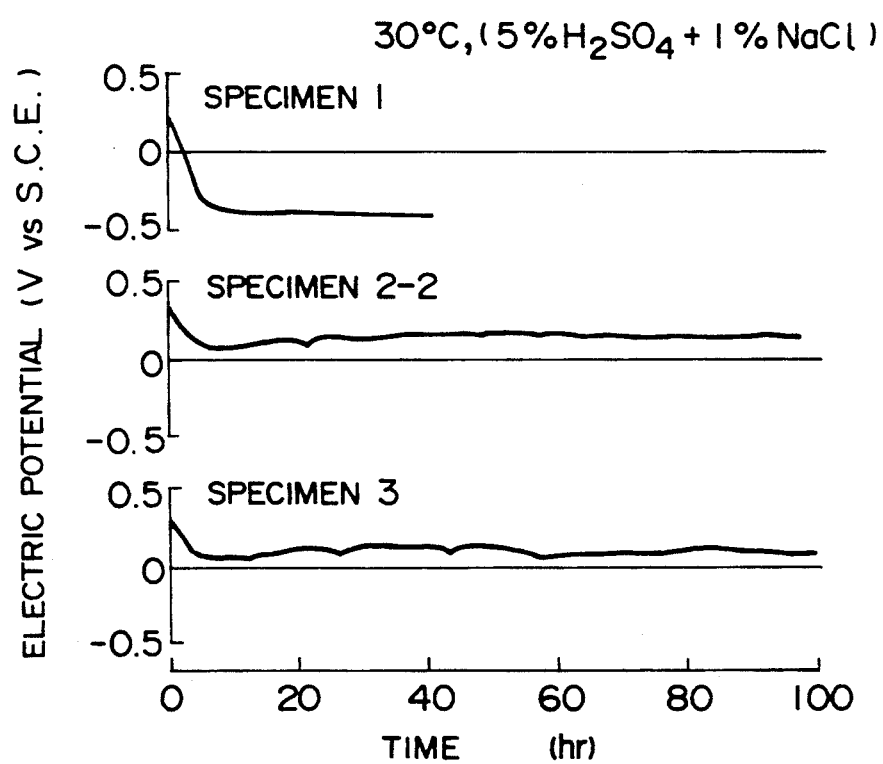
FIG. 3 is a change on standing in self potential for each of Specimens 1, 2-2 and 3 in aqueous (5% $H_2SO_4$+1%-NaCl) solution at 30° C.

FIG. 3 shows a change on standing in self potential for Specimen 1, 2-2 or 3 in an aqueous (5%-$H_2SO_4$+1%-NaCl) solution. The self potential for Referential Specimen 1 sank below the active state zone line immediately after being immersed in the solution, whereas in Specimen 2-2 or 3 according to the present invention such a sinking-in was not observed. From this fact, it can also be seen that Specimen 2-2 or 3 according to the invention is more corrosion-resistant than Referential Specimen 1.

As is apparent from the foregoing, Specimen 2-2, 3 or 4 according to the invention was remarkably improved in the resistance to general corrosion when compared to the resistance for the Referential Specimen which was prepared from a conventional stainless steel or a steel having an Mn/S ratio of more than 100.

Improvement of Resistance to Pitting

Figure 4:
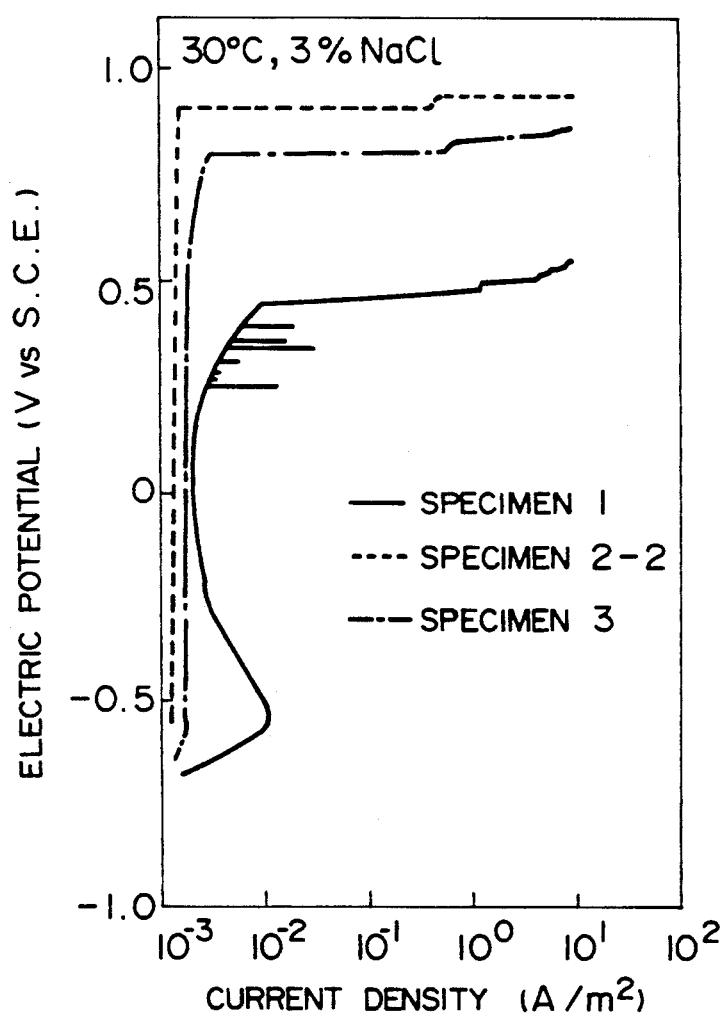
FIG. 4 shows anode polarization curves for Specimens 1, 2-2 and 3 in an aqueous 3%-NaCl solution at 30° C.

FIG. 4 shows anode polarization curves for Specimens 1, 2-2 and 3 in an aqueous 3%-NaCl solution at 30° C. As can be seen from the presence of a current density peak, an active state dissolution zone is formed for Referential Specimen 1. Further, from the rapid increase in current density on a relatively low level of potential (about 0.45 V), it can also be seen that putting has been stimulated at an early stage.

Inversely, in Specimens 2-2, and 3 such an active dissolution zone cannot be observed, and the rapid increase in current density occurred on a remarkably higher level of potential than that for Referential Specimen 1, showing a marked environment-isolating effect and improved resistance to corrosion.

Figure 5:
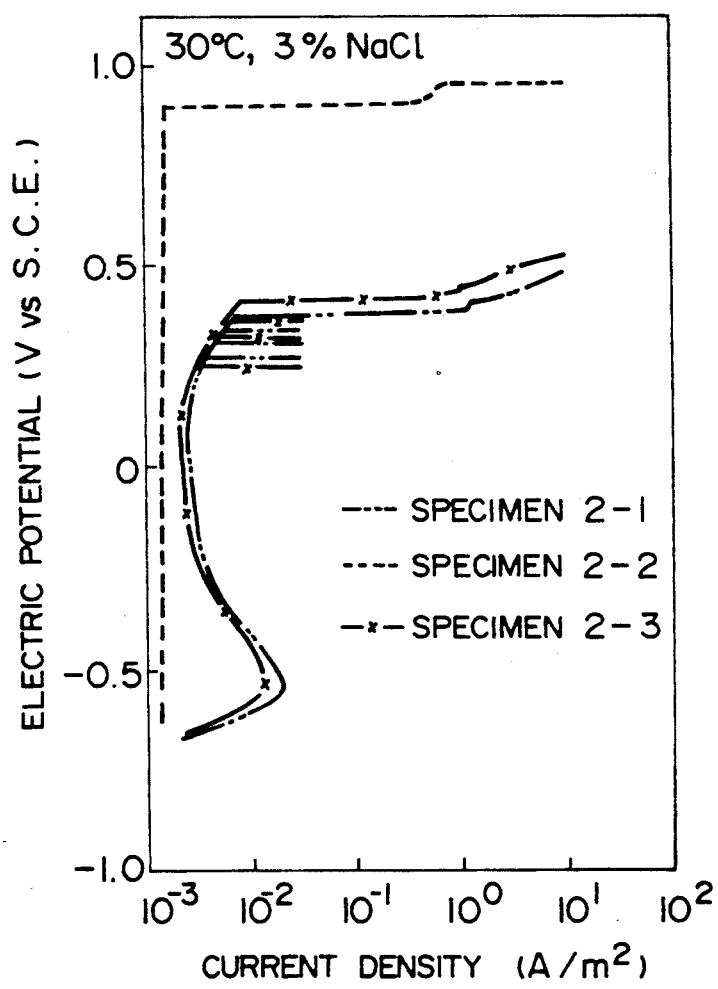
FIG. 5 shows anode polarization curves for Specimens 2-1, 2-2 and 2-3 in an aqueous 3%-NaCl solution at 30° C.

FIG. 5 shows anode polarization curves for Specimens 2, each of which has a coating different in total thickness, in an aqueous 3%-NaCl solution at 30° C. A current density peak was observed for both of Referential Specimens 2-1 and 2-3, the total thickness being 0.5 and 4 μm respectively, showing that an active state zone was formed for Specimens 2-1 and 2-3.

The rapid increase in current density on a lower level of potential (about 0.4 V) clearly shows that in these Referential Specimens pitting has been stimulated at an early stage.

On the other hand, in Specimen 2-2 having a coating with a total thickness of 2 μm according to the invention such an active dissolution zone cannot be observed and the rapid increase in current density cannot occur until a remarkably higher level of potential than the level for Referential Specimen 1. From this it is clear that Specimen 2-2 has an enhanced environment-isolating effect and good corrosion resistance. This is due to the fact that, as shown in FIG. 1, in Referential Specimen 2-1 having a coating with a thickness of 0.5 μm the environment-isolating effect and the improvement effect on corrosion resistance cannot be exerted sufficiently because the thickness is too thin; inversely, in Referential Specimen 2-3 cracks and delamination take place due to an increase in residual stress on the coating, resulting in low resistance to corrosion.

From these comparison data, it is confirmed that only Specimen 2-2 having a coating with a thickness of 2 μm is good in environment-isolating effect, whereas Specimens 2-1 and 2-3 have little environment-isolating effect and low resistance to corrosion.

Figure 6:
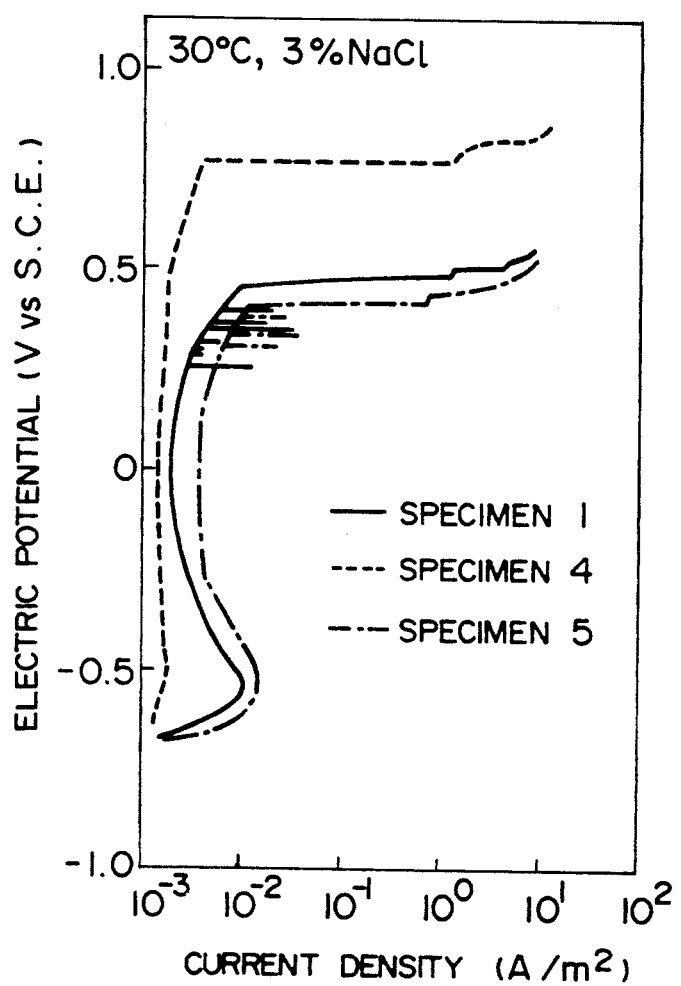
FIG. 6 shows anode polarization curves for Specimens 1, 4 and 5 in an aqueous 3%-NaCl solution at 30° C.

FIG. 6 shows anode polarization curves for Specimens 1, 4 and 5 in an aqueous 3%-NaCl solution at 30° C. From this it is also clear that in Specimen 4 the rapid increase in current density cannot be observed until a higher level of potential (about 0.76 V), showing an enhanced environment-isolating effect and increased resistance to corrosion, although an active state dissolution peak is observed to some extent.

Inversely, in Referential Specimen 5 of which the Mn/S ratio is more than 100, the active state dissolution peak is on a higher level than that for Referential Specimen 1, not to mention Specimen 4, and the rapid increase in current density is observed on a lower level of potential than that for Specimen 1, showing that severe pitting has been stimulated at an early stage.

From these comparison data, it can be seen that the resistance to pitting for Specimens 2-2, 3 and 4 according to the present invention is much improved than that for Referential Specimens prepared from a conventional stainless steel or a steel having an Mn/S ratio of more than 100.

EXAMPLE 2

Table 4 gives chemical compositions of the stainless steel substrates employed for preparing Specimens 1, 6 and 7. Referential Specimen 1 was made of SUS 304 on the market as used in Example 1, whereas Specimen 6 or 7 was prepared from the component-adjusted steel according to the present invention.

TABLE 4

| | (% by Wt.) Specimen | | | | | | | | | |
|---|---|---|---|---|---|---|---|---|---|---|
| No./ | C | Si | Mn | P | S | Ni | Cr | Mo | Cu | Bi |
| 1 | 0.05 | 0.49 | 0.98 | 0.034 | 0.022 | 8.11 | 18.21 | — | — | — |
| 6 | 0.05 | 0.50 | 0.49 | 0.008 | 0.002 | 11.00 | 18.20 | 0.50 | 0.32 | — |
| 7 | 0.05 | 0.53 | 0.51 | 0.030 | 0.002 | 9.27 | 19.03 | 0.52 | 0.21 | 0.09 |

The substrate was pretreated and ion plated in the same manner as described in Example 1 to prepare a specimen having a three layered-structure coating comprising Ti, TiC and TiN-layers in a total thickness as set forth in Table 5.

There are three kinds of Specimen 6 each of which has a total thickness of 0.5, 2 and 4 μm respectively, whereas Referential Specimen 7 or 1 has a coating with a total thickness of 2 μm.

Referential Specimen 1 was prepared in the same manner as described in Example 1, whereas Referential Specimen 7 has a two layered-structure coating comprising a TiN-layer directly coated onto the Ti-layer.

TABLE 5

| Specimen No. | Total Thickness (μm) |
|---|---|
| 1 | 2 |
| 6 6-1 | 0.5 |
| 6-2 | 2 |
| 6-3 | 4 |
| 7 | 2 |

Resistance to General Corrosion

Figure 7:
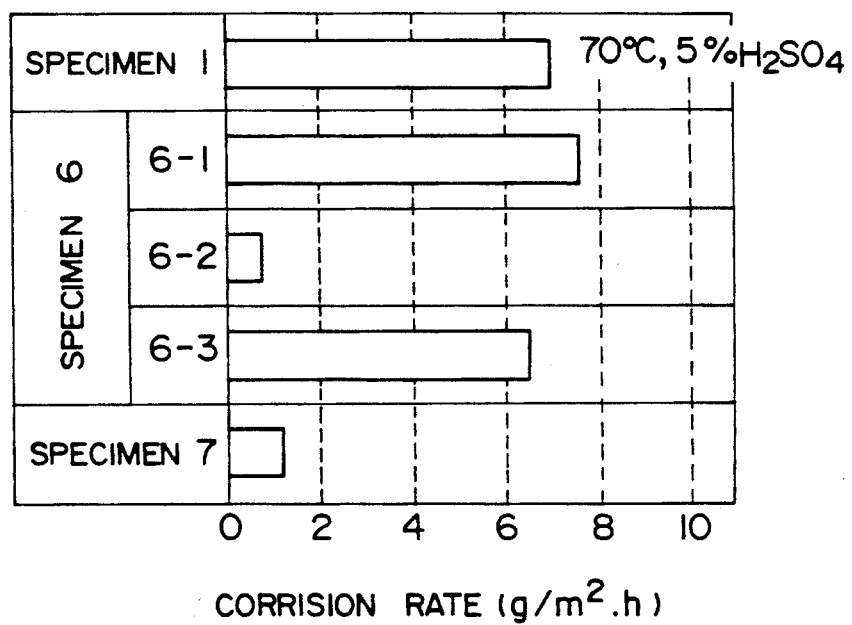
FIG. 7 shows corrosion rate curves for Specimens 1, 6 and 7 in an aqueous 5%-$H_2SO_4$ solution at 70° C.

FIG. 7 shows corrosion rate curves for Specimens 1, 6 and 7 in an aqueous 5%-$H_2SO_4$ solution at 70°. From this is is clear that Specimen 6-2 having a coating with a total thickness of 2 μm has the lowest corrosion rate, showing the enhanced environment-isolating effect and improved resistance to corrosion of the resultant coating.

However, in Specimen 6-1 having a coating with a total thickness of 0.5 μm the environment-isolating effect and corrosion-improving effect cannot be exerted sufficiently because the thickness is too thin. Inversely, in Specimen 6-3 having a coating with a total thickness of 4 μm, it is confirmed that the corrosion rate is high due to an increase in residual stress on the coating, giving a cracked and partially peeled coating low in resistance to corrosion.

On the other hand, in Specimen 7 according to the present invention, which is different in coating structure, the corrosion rate is much lower than that for Referential Specimen 1. The corrosion rate is approximately comparable to that for Specimen 6-2 according to the present invention, showing improved resistance to corrosion. Therefore, in Specimens 6-2 and 7 according to the invention the dissolution resistance in the active state zone is much higher than that for Specimen 1, showing much improved resistance to corrosion.

Figure 8:
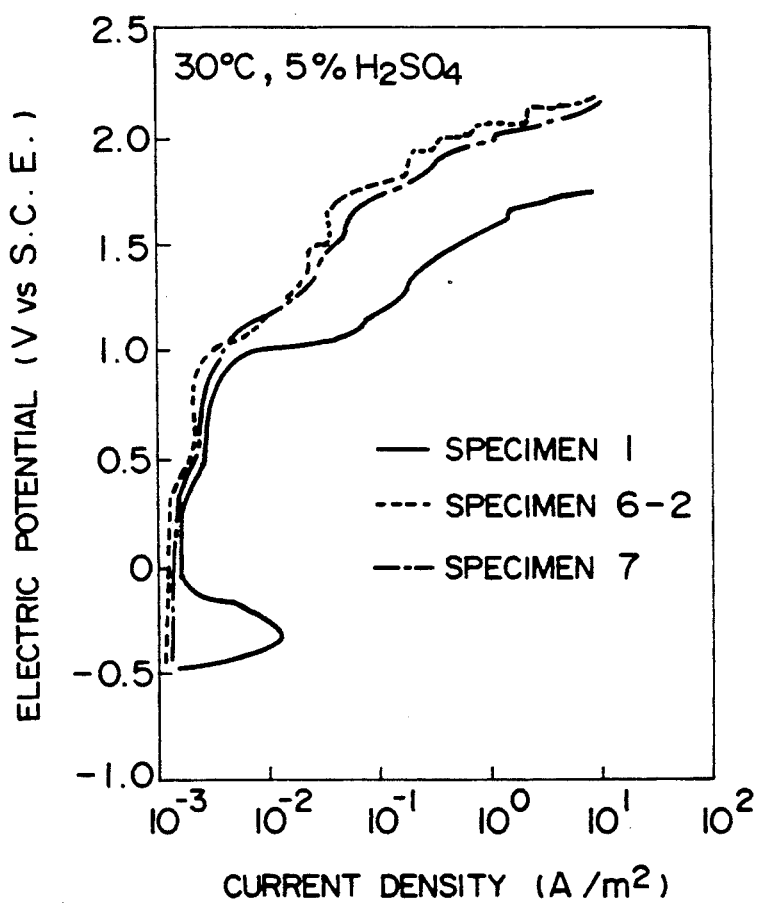
FIG. 8 shows anode polarization curves for Specimens 1, 6-2 and 7 in an aqueous 5%-$H_2SO_4$ solution at 30° C.

FIG. 8 shows anode polarization curves for Specimens 1, 6-2 and 7 in an aqueous 5%-$H_2SO_4$ solution at 30° C. From this it is clear that in Referential Specimen 1 a clear active state zone can be observed in a similar manner as shown in FIG. 2, whereas in Specimens 6-2 and 7 according to the present invention such an active state zone cannot be observed. The passivity-retaining current density for Specimens 6-2 or 7 is lower than that for Referential Specimen 1, showing that the passivity for Specimens 6-2 and 7 is much more stable than that for Referential Specimen 1. From this it is confirmed that Specimens 6-2 and 7 have high resistance to corrosion.

Figure 9:
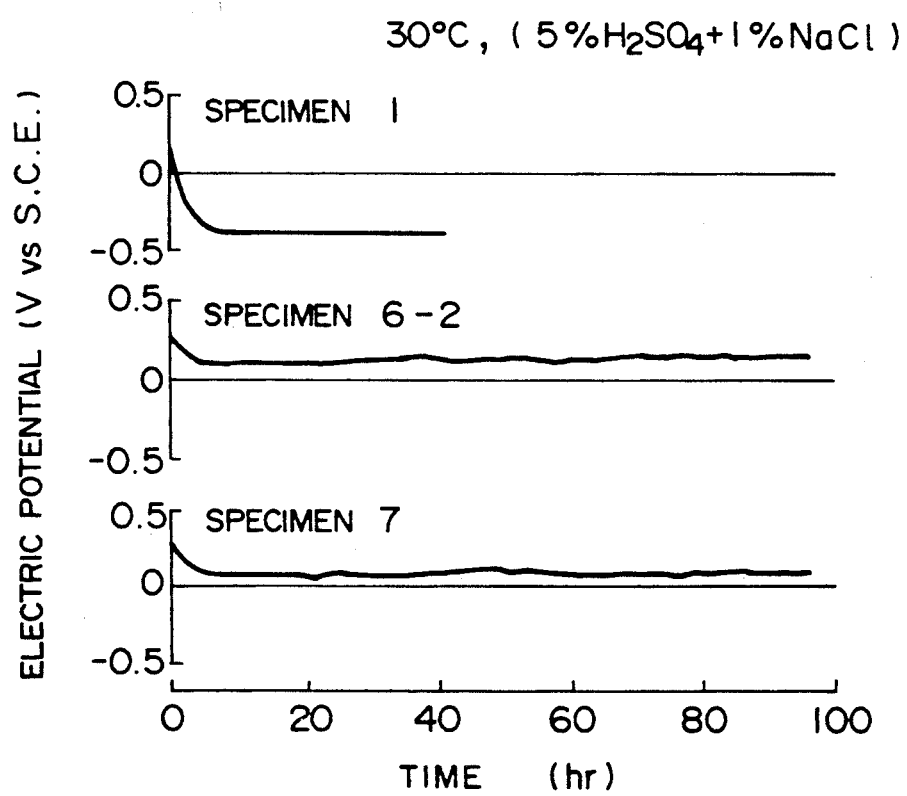
FIG. 9 is a change on standing in self potential for each of Specimens 1, 6-2 and 7 in an aqueous (5%-$H_2SO_4$+1%-NaCl) solution at 30° C.

FIG. 9 shows a change on standing in self potential for each of Specimens 1, 6-2 and 7 in an aqueous (5%-$H_2SO_4$+1%-NaCl) solution. The self potential for Referential Specimen 1 sank below the active state zone line immediately after immersion in a similar manner as shown in FIG. 3, whereas in Specimens 6-2 and 7 according to the present invention such a sinking-in of the self potential cannot be observed even after 100 hours.

From these comparative data, it is confirmed that Specimens 6-2 and 7 according to the invention is good in resistance to general corrosion.

Improvement of Resistance to Pitting

Figure 10:
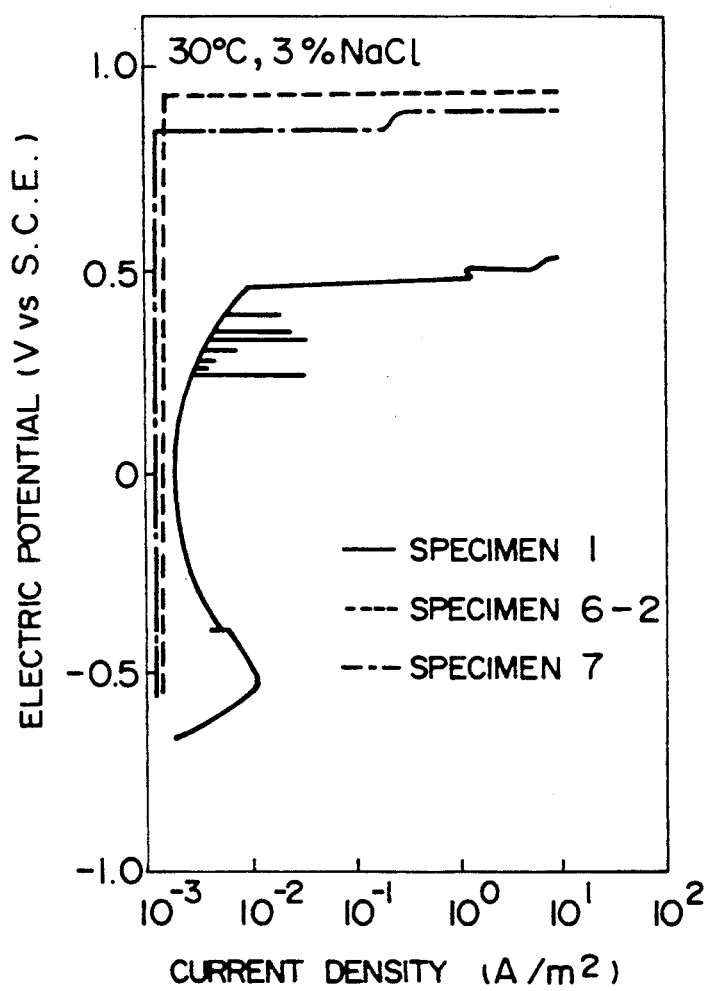
FIG. 10 shows anode polarization curves for Specimens 1, 6-2 and 7 in an aqueous 3%-NaCl solution at 30° C.

FIG. 10 shows anode polarization curves for Specimens 1, 6-2 and 7 in an aqueous 3%-NaCl solution at 30° C. From this it is clear that in Referential Specimen 1 a current density peak is observed which shows the presence of an active state dissolution zone. The rapid increase in current density on a relatively low level of potential (about 0.45 V) shows that pitting has been stimulated at an early stage.

On the other hand, in Specimens 6-2 and 7 such an active state zone cannot be observed and the rapid increase in current density is suppressed until a much higher potential level than that for Referential Specimen 1. The curves in FIG. 10 clearly show that Specimens according to the present invention have a marked environment-isolating effect and improved resistence to corrosion.

Figure 11:
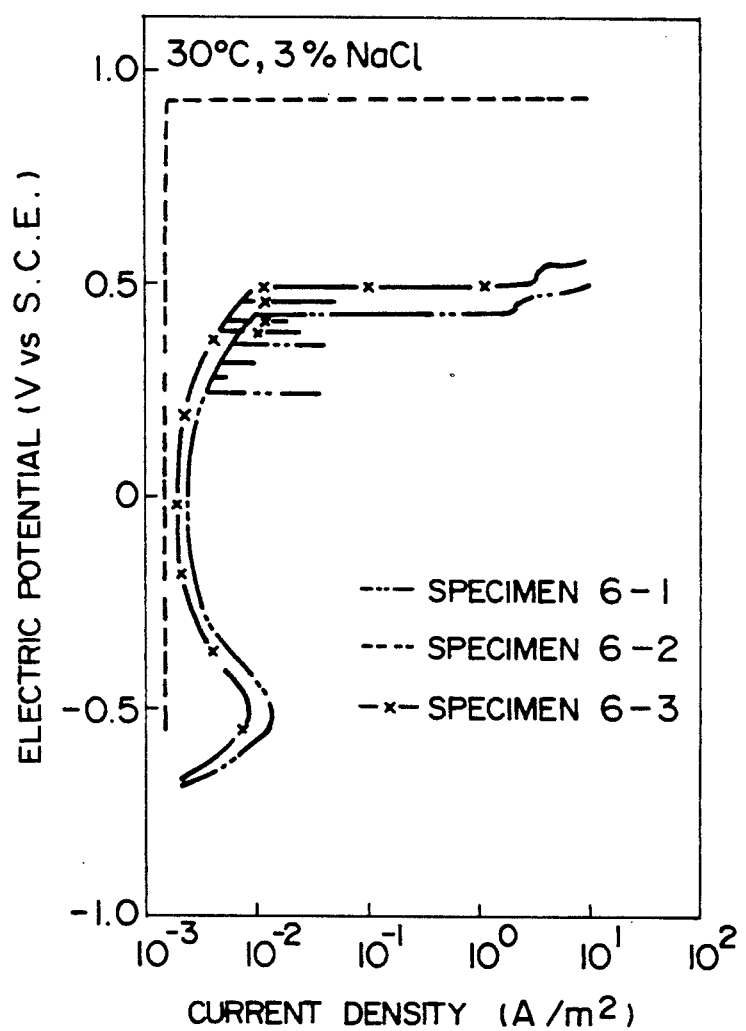
FIG. 11 shows anode polarization curves for Specimens 6-1, 6-2 and 6-3 in an aqueous 3%-NaCl solution at 30° C.

FIG. 11 shows anode polarization curves for Specimens 6-1, 6-2 and 6-3 in an aqueous 3%-NaCl solution at 30° C. From the current density peak, it is clear that in Specimens 6-1 and 6-3 an active state zone has been formed. Further, from the rapid increase in current density on a relatively low level of potential (about 0.45 V), it can be seen that pitting has been stimulated at an early stage. On the other hand, in Specimen 6-2 according to the present invention such an active state zone cannot be observed and the rapid increase in current density is suppressed until a much higher level of potential than that for Referential Specimen 1. The curves in FIG. 11 show that Specimens according to the present invention have a marked environment-isolating effect and improved resistance to corrosion.

In a similar manner as shown in FIG. 7, this is due to the fact that the coating having a total thickness of 0.5 μm is too thin to produce the intended environment-isolating effect and to improve the resistance to corrosion. When the coating has a total thickness of 4 μm, cracks and delamination take place due to a large quantity of stress on the coating, resulting in the low corrosion resistance.

Therefore, it is also confirmed that in Specimens 6 according to the invention, only Specimen 6-2 having a coating with a thickness of 2 μm has the enhanced environment-isolating effect, whereas in Referential Specimens having a coating with a thickness of 0.5 μm and 4 μm respectively have little environment-isolating effect and low resistance to corrosion.

From these comparative test data, it is confirmed that Specimens 6-2 and 7 according to the present invention exhibit much higher resistance to pitting than that for Referential Specimen prepared from a conventional stainless steel (SUS 304).

As illustrated above, the Ti surface-prepared stainless steel coated with a TiN-layer offers an enhanced environment-isolating effect and improved resistance to corrosion under wet conditions.

The stainless steel having a multi-structure coating according to the present invention thus obtained proves to serve as one of the most suitable materials for preparing tableware which can be used under wet conditions.

What is claimed is:

1. A process for improving the resistance to corrosion of a stainless steel, the process comprising coating the stainless steel having an Mn/S ratio of less than 100 as substrate by ion plating process with a Ti-layer for surface preparation, coating directly the resulting Ti-layer or indirectly a TiC-layer, which has been coated onto the Ti-layer in advance as intermediate, with a TiN-layer in a total thickness of 1 to 3 μm, the composition of the substrate comprising the following A or B:

| A | | B | |
|---|---|---|---|
| % by Wt. | Element | % by Wt. | Element |
| less than 0.08 | C | less than 0.08 | C |
| less than 1.0 | Si | less than 1.0 | Si |
| less than 1.0 | Mn | less than 1.0 | Mn |
| less than 0.04 | P | less than 0.04 | P |
| less than 0.01 | S | 0.005 to 0.010 | S |
| 8.0 to 12.0 | Ni | 8.0 to 12.0 | Ni |
| 17.0 to 20.0 | Cr | 17.0 to 20.0 | Cr |
| 0.40 to 0.80 | Mo | 0.40 to 0.80 | Mo |
| the balance | Fe | the balance | Fe. |

2. A process for improving the resistance to corrosion of a stainless steel, the process comprising coating the stainless steel by ion plating process with a Ti-layer for surface preparation, coating directly the resulting Ti-layer or indirectly a TiC-layer, which has been coated onto the Ti-layer in advance as intermediate, with a TiN-layer in a total thickness of 1 to 3 μm, the composition of the substrate comprising the following A or B:

| A | | B | |
|---|---|---|---|
| % by Wt. | Element | % by Wt. | Element |
| less than 0.08 | C | less than 0.08 | C |
| less than 1.0 | Si | less than 1.0 | Si |
| less than 0.7 | Mn | less than 0.7 | Mn |
| less than 0.04 | P | less than 0.04 | P |
| less than 0.005 | S | less than 0.005 | S |
| 8.0 to 12.0 | Ni | 8.0 to 12.0 | Ni |
| 17.0 to 20.0 | Cr | 17.0 to 20.0 | Cr |
| 0.40 to 0.80 | Mo | 0.40 to 0.80 | Mo |
| 0.30 to 0.50 | Cu | 0.10 to 0.30 | Cu |
| the balance | Fe | 0.03 to 0.12 | Bi |
| | | the balance | Fe |

* * * * *